United States Patent [19]

Pawlowski et al.

[11] Patent Number: 4,956,261
[45] Date of Patent: Sep. 11, 1990

[54] PHOTOSENSITIVE DIAZO AND PHOTOPOLYMERIZABLE RECORDING MATERIAL WITH A PHOTOSENSITIVE DIAZO INTERMEDIATE LAYER

[75] Inventors: Georg Pawlowski, Wiesbaden; Peter Lehmann, Kelkheim, both of Fed. Rep. of Germany

[73] Assignee: Hoechst Aktiengesellschaft, Frankfurt am Main, Fed. Rep. of Germany

[21] Appl. No.: 403,007

[22] Filed: Sep. 6, 1989

Related U.S. Application Data

[63] Continuation of Ser. No. 135,311, Dec. 21, 1987, abandoned.

[30] Foreign Application Priority Data

Dec. 23, 1986 [DE] Fed. Rep. of Germany ....... 3644160

[51] Int. Cl.$^5$ .................... G03F 7/021; G03F 7/027; G03C 1/76
[52] U.S. Cl. .................................. 430/156; 430/175; 430/176; 430/271; 430/273
[58] Field of Search ............... 430/175, 156, 176, 271, 430/273

[56] References Cited

U.S. PATENT DOCUMENTS

| | | | |
|---|---|---|---|
| 3,396,019 | 8/1968 | Uhlig | 430/175 |
| 3,867,147 | 2/1975 | Teuscher | 430/175 |
| 3,905,815 | 9/1975 | Bonham | 430/156 |
| 4,171,974 | 10/1979 | Golda et al. | 430/175 |
| 4,233,390 | 11/1980 | Jargiello | 430/156 |
| 4,289,838 | 9/1981 | Rowe et al. | 430/156 |
| 4,316,949 | 2/1982 | Patrellis et al. | 430/156 |
| 4,387,151 | 6/1983 | Bosse et al. | 430/175 |
| 4,631,245 | 12/1986 | Pawlowski | 430/175 |
| 4,647,475 | 3/1987 | Inukai et al. | 430/156 |
| 4,659,645 | 4/1987 | Frommeld et al. | 430/175 |
| 4,687,727 | 8/1987 | Toyoma et al. | 430/175 |
| 4,886,731 | 12/1989 | Sypek et al. | 430/156 |

FOREIGN PATENT DOCUMENTS

| | | | |
|---|---|---|---|
| 1153236 | 9/1983 | Canada | 430/175 |
| 1172492 | 8/1984 | Canada | 430/175 |
| 86-5877 | 3/1987 | South Africa | 430/175 |
| 1141544 | 1/1969 | United Kingdom . | |
| 2023861 | 1/1980 | United Kingdom . | |
| 2032124 | 4/1980 | United Kingdom . | |
| 2044788B | 3/1983 | United Kingdom | 430/156 |

*Primary Examiner*—Charles L. Bowers, Jr.
*Attorney, Agent, or Firm*—Foley & Lardner, Schwartz, Jeffery, Schwaab, Mack, Blumenthal & Evans

[57] ABSTRACT

A photosensitive recording material with a layer base and a photosensitive layer, which essentially contains a diazonium salt polycondensation product, a polymeric binder which is insoluble in water and soluble in organic solvents and soluble or at least swellable in aqueous alkaline solutions, a polymerization initiator which forms free radicals when exposed to actinic radiation and a polymerizable ethylenically unsaturated compound containing at least one unsaturated group and having a boiling point at normal pressure of over 100° C., wherein the recording material contains, between the photosensitive layer and the layer base, a photosensitive intermediate layer which essentially contains a diazonium salt polycondensation product and a polymeric binder which is insoluble in water and soluble in organic solvents and soluble or at least swellable in aqueous alkaline solutions.

17 Claims, No Drawings

PHOTOSENSITIVE DIAZO AND PHOTOPOLYMERIZABLE RECORDING MATERIAL WITH A PHOTOSENSITIVE DIAZO INTERMEDIATE LAYER

This application is a continuation of application Ser. No. 07/135,311, filed Dec. 21, 1987 now abandoned.

BACKGROUND OF THE INVENTION

The present invention relates to a photosensitive recording material with a layer base and a photosensitive layer, which essentially contains a diazonium salt polycondensation product, a binder which is insoluble in water and soluble or at least swellable in organic solutions or aqueous alkaline solutions, a polymerization initiator which forms radicals when exposed to actinic radiation and a polymerizable olefinically unsaturated compound containing at least one unsaturated group and having a boiling point at normal pressure of over 100° C. The copying material prepared therefrom is mainly suitable for the preparation of lithographic plates of high quality.

It is known that the lithographic and printing properties of photosensitive mixtures can be effected by suitable combinations of photosensitive layers of different composition.

Thus, for example, U.S. Pat. No. 3,905,815 describes a photosensitive recording material which on a suitable base material, has first a very thin layer of a diazonium salt compound and on top thereof, a layer of a photopolymerizable compound. The resolving power of the recording material is claimed to be improved by this combination.

A similar combination is proposed in German Offenlegungsschrift No. 2,843,762. In this case a diazonium salt polycondensation compound which is water-soluble and is intended to act as a hydrophilizing intermediate layer on the base at the same time is used as lower layer. Here, too, an improvement of the resolving power and also an improved storage stability are described.

From the German Offenlegungsschriften No. 2,024,244, 3,130,987, 3,036,077 and 3,404,366, photosensitive mixtures (albeit as monolayers) are known which are composed of the combination of a diazonium salt polycondensation product with a polymeric binder which is soluble in aqueous alkaline developers or at least swellable. Such mixtures exhibit very good lithographic properties, but, in addition to certain specific disadvantages, have the general and therefore decisive disadvantage that their photosensitivity and, in particular, the development capability decreases drastically at fairly high layer thicknesses so that such layers are, in general, suitable only for medium print runs. In addition, the more difficult development capability results in an increased consumption of developer.

From the German Offenlegungsschriften No. 2,361,931, 2,903,270, 3,007,212, 3,425,328 and the German patent application with the application number P 3,528,309.2, photosensitive recording materials are known whose photosensitive layer contains a diazonium salt polycondensation product, a polymerizable compound, a photoinitiator and a polymeric binder. An improved resolution, increased print runs and fast aqueous alkaline development capability are mentioned as advantages of this combination. A disadvantage of these mixtures is, however, their limited storage stability.

SUMMARY OF THE INVENTION

It is therefore an object of the present invention to provide a photosensitive recording material which, while retaining the known good lithographic properties of monolayers containing diazonium salt, makes a markedly higher print run possible with comparable sensitivity, produces an improved storage stability and also has a reduced consumption of developer.

In accomplishing these and other objects there is provided according to the present invention a photosensitive recording material comprising a layer base, a photosensitive intermediate layer on the layer base consisting essentially of a diazonium salt polycondensation product and a polymeric binder, and a photosentive layer on the intermediate layer consisting essentially of a diazonium salt polycondensation product, a polymeric binder, a polymerization initiator which forms free radicals when exposed to actinic radiation, and a polymerizable ethylenically unsaturated compound having a boiling point at atmospheric pressure of over 100° C., wherein the polymeric binder is insoluble in water and soluble in organic solvents and soluble or at least swellable in aqueous alkaline solutions.

Surprisingly, it has now been found that the properties described in defining the object can be achieved if the combination of two layers according to the invention is used. It was particularly surprising that, with this combination, relatively thick layers can also be developed easily and without stain in aqueous alkali and they nevertheless require only a small amount of light to harden them. The abrasion resistance is, however, so high that maximum run performances can be achieved.

A further advantage of the photosensitive recording material according to the invention is that both layers can be processed with the same developer system. Preferably, use is made of a developer system with a purely aqueous or aqueous alkaline base which optionally contains small quantities of an organic surfactant or a high-boiling, nontoxic solvent.

DESCRIPTION OF THE PREFERRED EMBODIMENTS

The invention provides a photosensitive recording material comprising, between the photosensitive layer and the layer base, a photosensitive intermediate layer which essentially contains a diazonium salt polycondensation product and a polymeric binder which is insoluble in water, is soluble or at least swellable in organic solvents and in aqueous alkaline solutions.

Suitable diazonium salt polycondensation products are condensation products of aromatic diazonium salts, for example, of diphenylamine-4-diazonium salts, which are capable of condensation, with aldehydes, preferably formaldehyde. With particular advantage, cocondensation products are used which, in addition to the diazonium salt units, also contain other, nonphotosensitive units which are derived from compounds B which are capable of condensation, in particular aromatic amines, phenols, phenol ethers, aromatic thioethers, aromatic hydrocarbons, aromatic heterocyclic compounds and organic acid amides. These condensation products are described in German Patent No. 2,024,244. Generally, all the diazonium salt polycondensation products which are described in German Offenlegungsschrift No. 2,739,774, are suitable.

The diazonium salt units A-N$_2$Q are preferably derived from compounds of the formula (R$^8$—$^{R9}$)$_p$R-$^{10}$—N$_2$Q in which Q denotes the anion of the diazonium compound,
p denotes an integer from 1 to 3,
R$^8$ denotes an aromatic radical containing at least one position capable of condensation with an active carbonyl compound,
R$^{10}$ denotes a phenylene group,
R$^9$ denotes a single bond or one of the groups:

—(CH$_2$)$_q$—NR$^{11}$13 ,

—O—(CH$_2$)$_r$—NR$^{11}$—,

—S—(CH$_2$)$_r$—NR$^{11}$—,

—S—CH$_2$CO—NR$^{11}$—,

—O—R$^{12}$—O—,

—O—

—S —or

—CO—NR$^{11}$— where
q is a number from 0 to 5,
r is a number from 2 to 5,
R$^{11}$ is hydrogen, an alkyl group containing 1 to 5 carbon atoms, an aralkyl group containing 7 to 12 carbon atoms or an aryl group containing 6 to 12 carbon atoms, and
R$^{12}$ is an arylene group containing 6 to 12 carbon atoms.

Of the compound classes mentioned, the condensation products of diphenylamine-4-diazonium salts, which are optionally substituted by alkyl, alkoxy groups or halogen atoms, are preferred. The optionally substituted diphenyl ethers, diphenyl sulfides, diphenyl methanes or diphenyls are preferred as second components B. At the same time, the bismethoxymethyl, bishydroxymethyl or bisacetoxymethyl derivatives of the parent substances are employed with particular advantage. The condensation product may contain on average 0.1 to 50, preferably 0.2 to 20 B units per A-N$_2$Q unit.

Further, particularly advantageous polycondensation products are obtained by condensing an optionally substituted diphenylamine diazonium salt first with an aromatic compound R$^a$—O—CH$_2$—R$^b$ and then with an aromatic compound R$^a$—O—CH$_2$-R$^c$—CH$_2$—O—R$^{apg,11}$, where R$^a$ is a hydrogen atom, an alkyl or aliphatic acyl radical, R$^b$ is an optionally substituted aromatic radical and R$^c$ is the radical of an aromatic hydrocarbon, of a phenol, of a phenol ether, or an aromatic thioether, of an aromatic heterocyclic compound or of an organic acid amide. These condensation products are described in European Patent application No. 126,875.

According to the invention, the intermediate layer contains in general 5 to 90, preferably 10 to 70% by weight of the diazonium compound. The photosensitive layer contains, in general, between 5 and 60, preferably 10 to 40% by weight of the diazonium salt polycondensation product referred to the total content of the non-volatile constituents. Depending on the nature of the application, the diazonium salt compound used in the intermediate layer may be identical to, or different from, that of the photosensitive layer.

As binders for the intermediate layer, use may be made of virtually all the polymeric binders which are insoluble in water, are soluble in organic solvents and in aqueous alkaline solutions or are at least swellable. Suitable binders are described in numerous applications.

Special mention should be made of binders containing carboxyl groups, such as, for example, copolymers of (meth)acrylic acid and its unsaturated homologs, such as, for example, crotonic acid or the like, copolymers of maleic anhydride or its half esters, reaction products of polymers containing hydroxyl groups with cyclic anhydrides of dicarboxylic acids, and also their mixtures.

Furthermore, reaction products of polymers which carry H-acid groups which have been completely or partially reacted with activated isocyanates, such as, for example, reaction products of polymers containing hydroxyl groups with aliphatic or aromatic sulfonyl isocyanates or phosphinic acid isocyanates are suitable.

In addition, the following are suitable: polymers containing hydroxyl groups such as, for example, copolymers of hydroxyalkyl (meth)acrylates, copolymers of allyl alcohol, copolymers of vinyl alcohol, or polyurethanes or polyesters, and also epoxy resins provided they carry a sufficient number of free OH groups or have been modified so that they are soluble in aqueous alkaline solutions, or those polymers which carry aromatically bonded hydroxyl groups such as, for example, condensation products of carbonyl compounds capable of condensation, in particular formaldehyde, with aromatic phenols or copolymers of hydroxystyrene. Finally, copolymers of (meth)acrylamide with alkyl (meth)acrylates may be used; such polymers are, however, in general not preferred.

The polymers described above are suitable, in particular, if they have a molecular weight between 500 and 200,000 or more, preferably 1,000 to 100,000 and have acid numbers between 10 and 250, preferably 20 and 150, or hydroxyl numbers between 50 and 750, preferably 100 and 600.

As preferred classes of binders, mention may be made of the following:

Copolymers of (meth)acrylic acid with alkyl (meth)acrylates, (meth)acrylonitrile or the like;

Copolymers of crotonic acid with alkyl (meth)acrylates, (meth)acrylonitrile or the like;

Copolymers of vinylacetic acid with alkyl (meth)acrylates;

Copolymers of maleic anhydride with optionally substituted styrenes;

Copolymers of maleic anhydride with unsaturated hydrocarbons;

Copolymers of maleic anhydride with unsaturated ethers;

Copolymers of maleic anhydride with unsaturated esters;

Esterification products of the copolymers of maleic anhydride;

Esterification products of polymers containing hydroxyl groups with the cyclic anhydrides of aliphatic, saturated or unsaturated, aromatic or heteroaromatic di- or polycarboxylic acid;

Reaction products of polymers containing hydroxyl groups with aliphatic, saturated or unsaturated or aromatic sulfonyl isocyanates;

Reaction products of polymers containing hydroxyl groups with aliphatic, saturated or unsaturated or aromatic phosphinic acid isocyanates;

Copolymers of hydroxyalkyl (meth)acrylates with alkyl methacrylates, methacrylonitrile or the like;

Copolymers of allyl alcohol with optionally substituted styrenes;

Copolymers of vinyl alcohol with alkyl (meth)acrylates or other unsaturated compounds capable of polymerization;

Polyurethanes provided they have a sufficient number of free OH groups;

Epoxy resins;

Polyesters;

Partially saponified polyvinyl acetate copolymers, Polyvinyl acetals with free OH groups;

Copolymers of hydroxystyrene with alkyl (meth)acrylates or the like, phenol-formaldehyde resins such as, for example, novolaks and other similar products.

Of these the copolymers of (meth)acrylic acid with alkyl (meth)acrylates and/or (meth)acrylonitrile, the copolymers of maleic anhydride and its esterification products, the esterification products of polymers containing hydroxyl groups with the cyclic anhydrides of di- or polycarboxylic acids, copolymers of hydroxyalkyl (meth)acrylate with alkyl (meth)acrylates and/or (meth)acrylonitrile and (meth)acrylic acid, copolymers of vinyl alcohol, in particular, partially saponified polyvinyl acetate copolymers or polyvinyl acetals or polyurethanes are preferred.

Of these polymeric compound classes, those polymers are particularly preferred which can be derived from polyvinyl alcohol. Such polymers are described, in particular, in German Offenlegungsschrift 3,404,366 and in the unpublished European patent application having the application number 86,110,604.5.

Of these, particular preference is given to the binders which are described in German Offenlegungsschrift 3,404,366. The acid anhydrides employed to prepare the binders are preferably derived from a di- or tricarboxylic acid, in particular, a dicarboxylic acid, and may contain 1, 2 or more rings.

Particularly preferred binders are obtained by reacting acid anhydrides of one of the formulae I, II or III

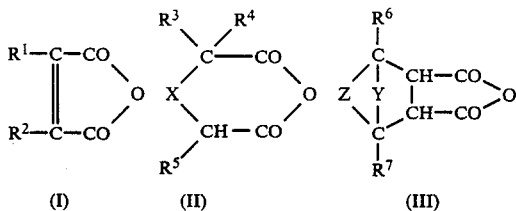

in which

R¹ and R² denote individually hydrogen atoms, alkyl groups or halogen or are joined to each other to form an aromatic or heteroaromatic, optionally substituted and optionally partially hydrogenated 5- or 6- membered ring, onto which up to two aromatic or cycloaliphatic rings may be fused, R³, R⁴ individually denote hydrogen atoms or and R⁵ alkyl groups, or R³ and R⁵ are joined to each other to form an optionally substituted saturated or unsaturated aliphatic ring which may have five or six ring members including X, R⁶ and R⁷ denote hydrogen atoms or alkyl groups, X denotes a single bond, a 1,1-alkylene group, a 1,1-cycloalkylene group which are optionally substituted, an oxygen or sulfur atom, Y denotes an oxygen or sulfur atom, a 1,1 -or 1,2-alkylene group or a 1,2-alkenylene group onto which an aromatic or cycloaliphatic ring is optionally fused, and Z denotes ring members necessary to complete a saturated or unsaturated, optionally substituted ring, it being possible for up to two aromatic or cycloaliphatic rings to be fused onto this ring.

If R¹, R², R³, R⁴, R⁵, R⁶ or R⁷ denote alkyl groups, these contain in general 1 to 4, preferably 1 to 2 carbon atoms. Substituents which may be bonded to the aromatic or cycloaliphatic rings are, for example, alkyl groups, alkoxy groups, halogen atoms, nitro groups or carboxyl groups.

Examples of suitable acid anhydrides are:

Maleic acid anhydride and derivatives, for example, dimethylmaleic anhydride, citraconic anhydride, chloromaleic anhydride or dichloromaleic anhydride;

Succinic anhydride and derivatives, for example methyl succinic anhydride;

Glutaric anhydride and derivatives, for example 3-methylglutaric anhydride, 3,3-tetramethyleneglutaric anhydride or camphoric anhydride;

3-Oxaglutaric anhydride and derivatives;

Phthalic anhydride and substitution products, for example, chloro, nitro or carboxyphthalic anhydride;

Partially or completely hydrogenated phthalic anhydride, for example hexahydrophthalic anhydride or cyclohexene-1,2-dicarboxylic acid anhydride;

Naphthalene-2,3-dicarboxylic acid anhydride or naphthalene-1,8-dicarboxylic acid anhydride or their substitution products;

Pyridine-o-dicarboxylic acid anhydride and its substitution products;

Pyrazine-o-dicarboxylic acid anhydride and its substitution products;

Furan-o-dicarboxylic acid anhydride or furan-2,5-dicarboxylic acid anhydride, their substitution products and also their partially or completely hydrogenated derivatives;

Thiophene-o-dicarboxylic acid anhydride or thiophene-2,5-dicarboxylic acid anhydride, their substitution products and also their completely or partially hydrogenated derivatives;

Di- or polycyclic anhydrides which are produced by Diels-Alder reaction of a diene with maleic anhydride, for example the addition products of furan, anthracene, 1,3-cyclohexadiene or cyclopentadiene and maleic anhydride.

Preferred are the reaction products with maleic, phthalic, succinic, 3-oxaglutaric anhydride and pyridine-2,3 dicarboxylic acid anhydride.

Suitable polymers containing hydroxyl groups are, in particular, polymers containing vinyl alcohol units, but also epoxy resins and saponified epoxy resins, copolymers of allyl alcohol or higher unsaturated alcohols, polyhydroxyalkyl acrylates and methacrylates and similar polymers.

Suitable polymers containing vinyl alcohol units are partially saponified polyvinyl esters, polyvinyl acetals with free hydroxyl groups and also corresponding reaction products of copolymers or copolymers containing vinyl ester or vinyl acetal or vinyl alcohol units.

The molecular weight of the binders containing carboxyl groups may vary within wide ranges. In general, binders with mean molecular weights between 5,000 and about 200,000 and over, preferably between 10,000 and 100,000 are employed. The acid number of the binder may, in general, be between 5 and 80, preferably between 10 and 70.

The quantitative proportion of binder in the intermediate layer is, in general, about 15 to 95, preferably about 30 to 90% by weight referred to the nonvolatile constituents of the photosensitive intermediate layer. In the photosensitive layer, the proportion of the binder employed according to the invention is, in general, between about 5 and 80, preferably between about 10 and 60% by weight, referred to the nonvolatile constituents of this layer.

In principle, the same polymeric binders can be used for the photosensitive layer, the polymers described in German Offenlegungsschrift No. 3,404,366 being preferred in particular. However, the binders which are known from the simultaneously filed applications (86/K068, 86/K069 and 86/K070) can also be used with similarly good success. The binders of the photosensitive layer may be identical to, or different from those of the intermediate layer. However, it is advantageous if the binders used are structurally similar.

The photosensitive layer contains, in addition, a photopolymerizable compound and also a suitable photoinitiator. As photoinitiators, a multiplicity of compounds, optionally also mixtures of two or more different, often synergistically acting compounds, may be used. Examples are benzoin and its derivatives, polynuclear quinones, acridine derivatives, for example 9-phenylacridine, 9-(p-methoxyphenyl)acridine; benz[a]phenazine, 10-methoxy-benz[a]phenazine; quinoxaline derivatives, for example 6,4',4''-trimethoxy-2,3-diphenylquinoxaline, 4',4''-dimethoxy-2,3-diphenyl-5-azaquinoxaline; aromatically substituted bistrichloromethyl-s-triazines or trichloromethyl substituted carbonyl methylene heterocyclic compounds, for example 2-(p-trichloromethylbenzoylmethylene)-3-ethylbenzothiazoline. Such trichloromethyl compounds are particularly preferred. The quantity of the photoinitiators is, in general between about 0.05 and 10, preferably between about 0.5 and 5% by weight of this layer, referred to the nonvolatile constituents.

Acrylic or methacrylic acid esters, and also acrylic or methacrylic acid urethanes of polyhydric, in particular primary, alcohols are preferably employed as photopolymerizable compounds. The alcohols may contain 1-8, preferably 2 to 6, OH groups.

Examples of suitable esters are trimethylolpropane triacrylate and -methacrylate, and also its ethoxylated or propoxylated derivatives, pentaerythritol tri- and tetraacrylate or the corresponding methacrylates, dipentaerythritol monohydroxypentaacrylate and -methacrylate, dipentaerythritol hexaacrylate and -methacrylate, propyleneglycol diacrylate and -methacrylate, glycerol di- and tri(meth)acrylate, polyethylene glycol di(meth)acrylate and bis(meth)acrylates of ethoxylated bisphenol A derivatives. Such compounds can be prepared formally by reaction of alcohols with the corresponding (meth)acrylic acid derivatives. If the alcohols are reacted with isocyanatoalkyl (meth)acrylates, structurally similar urethane groups are obtained in the monomers or oligomers which can be used with equal advantage.

Suitable monomers or oligomers containing urethane groups can, however, be prepared in a manner such that, for example, a hydroxyalkyl (meth)acrylate is reacted with a di-or polyfunctional isocyanate. These isocyanates may in turn be obtained by reacting diisocyantes with diols or triols to form oligomeric compounds. Finally, suitable monomers or oligomers containing urethane groups may also be obtained in a manner such that a diisocyanate is reacted with a polyol in a manner such that the product still has free OH groups, which finally react with a (meth)acrylic acid derivative or an unsaturated isocyanate.

Suitable monomers can also be prepared by reacting a low-molecular or oligomeric epoxide with a (meth)acrylic acid derivative. The free OH groups produced in this process may also, according to requirements, be completely or partially esterified with an unsaturated compound.

The photopolymerizable compounds preferably employed within the scope of the invention have a boiling point at normal pressure of above 100° C. and have molecular weights between about 300 and 5,000 g/mol. The proportion of photopolymerizable compounds referred to the nonvolatile constituents of the photosensitive layer is about 10 to 65, preferably about 30 to 60%, by weight.

Both layers may in addition contain acids, thermal polymerization inhibitors or thermally activatable initiators, dyestuffs, pigments, leveling agents, plasticizers, wetting agents and other normal additives.

The nature and quantity of the additives depends on the field of application envisaged for the photosensitive mixture. In this connection, it should always be borne in mind that the added substances must not absorb a crucial proportion of the light necessary for the crosslinking.

To stabilize both the photosensitive layer and also the photosensitive intermediate layer, it is advantageous to add a compound with an acidic nature to them. Mineral acids and strong organic acids, such as, for example, phosphoric acid, sulfuric acid, perchloric acid, boric acid or p-toluene sulfonic acid are suitable. Phosphoric acid is particularly suitable for this purpose.

Both layers may contain dyestuffs and/or pigments which may act both as a contrast agent and also as a layer consolidating agent. Suitable dyestuffs are specified, for example, in U. S. Patent No. 3,218,167 and 3,884,693. Particularly suitable are, for example, Victoria Pure Blue FGA (C.I. Basic Blue 81), Renol Blue B2G-HW (C.I. 74160), Crystal Violet (C.I. 42555), Rhodamine 6 GDN (C.I. 45160) or Renol Carmine FBB-HW (C.I Pigment Red 146). To increase the image contrast during exposure, Metanil Yellow (C.I. 13065), Methyl Orange (C.I. 13025) or preferably phenylazodiphenylamine may be used.

For certain applications it has proved expedient to add to one of the two layers a pigment whose mean particle size is larger than the total layer thickness of the photosensitive layers. Such pigments shorten the evacuation time in the exposure frame considerably and reduce the risk of air inclusions between copying material and master, which may, for example, lead to undesirable halations.

Finally, one or both of the photosensitive layers may incorporate thermal initiators for a post-polymerization or post cross-linking initiated by heat. Such thermal initiators are described in German application No. P 3,617,499.8 (86/K025).

The following preferred composition in terms of nonvolatile constituents may consequently be specified for the intermediate layer:
binder: 30 to 90%
diazonium salt polycondensation product: 10 to 70%
acid: 0 to 10%
dyestuff or pigment: 0 to 10%
exposure contrast agent: 0 to 5%
spacer pigment: 0 to 5%
thermal initiator: 0 to 5%

The preferred composition for the photosensitive layer may be summarized as follows:
binder: 10 to 50%
diazonium salt polycondensation product: 10 to 40%
photopolymerizable compound: 30 to 60%
photoinitiator: 0.5 to 5%
acid 0 to 10%
dyestuff or pigment: 0 to 10%
exposure contrast agent: 0 to 5%
spacer pigment: 0 to 5%
thermal initiator: 0 to 5%

A suitable base material is coated with the two photosensitive layers from appropriate organic solvents or solvent mixtures, in general by pouring or spraying. For this purpose, the intermediate layer is applied first and dried sufficiently, and then the photosensitive layer is applied thereto. The drying of this layer should in this case take place so rapidly that only trivial incipient solution of the surface of the intermediate layer can take place. The photosensitive layers may, however, also be applied first to a temporary layer base from which they can be separated mechanically and thereafter transferred by lamination to the final layer base, for example, a nickel foil or the copper layer of a printed circuit board.

Depending on the layer constituents, for example, alcohols such as methanol or ethanol, glycol ethers such as ethylene glycol, monomethyl ether or propylene glycol monomethyl ether, dimethylformamide or diethylformamide, ethers such as dioxan or tetrahydrofuran, esters such as ethyl acetate, butyl acetate or ethylene glycol monomethyl ether acetate, ketones such as ethyl methyl ketone or cyclohexanone, or the like may be used as solvents for the preparation of the coating solutions. In this connection, the partial ethers of the glycols, for example, ethylene glycol monomethyl ether, have proved to be beneficial solvents.

The layer thickness of the intermediate layer is about 0.1 to 3.0 $\mu$m, preferably about 0.2 to 1.2 $\mu$m, and that of the photosensitive layer about 0.25 to 6.0 $\mu$m, preferably about 0.4 to 2.0 $\mu$m. The total layer thickness of the two layers is between about 0.5 and 6 $\mu$m, preferably between about 1.0 and 3.0 $\mu$m. The layer thickness ratio of intermediate layer to photosensitive layer may vary in the range between about 1:50 and 5:1, but a ratio of about 1:10 to 2:1 is preferred.

Suitable layer bases are, for example, magnesium, zinc, copper, mechanically, chemically and electrochemically grained aluminum, anodized aluminum, steel, and also polyester or cellulose acetate film, perlon gauze, etc., whose surface may, if necessary, be subjected to a pretreatment. The base material may at the same time act as final layer base or as temporary base material from which the photosensitive layer is transferred to the workpiece to be processed by means of lamination.

The recording material prepared with the photosensitive mixtures serves, on the one hand, to prepare images on suitable bases or receiving sheets, and on the other hand, to prepare reliefs which are used as printing plates, screens, photoresists and the like.

The mixtures may also be employed in the photoresist technique, for example, to prepare letterpress, gravure or multimetal printing plates or printed circuits. In this application, the enhanced resolution compared with the photopolymerizable mixtures otherwise used is of particular advantage in many cases.

The mixture is particularly preferred for preparing lithograpic printing plates, aluminum being preferred as base material.

For this purpose, aluminum is preferably suitable which is pretreated in the usual manner, for example by mechanical, chemical or electrochemical graining and, optionally, subsequent anodic oxidation. A further treatment of this base material, for example with polyvinyl phosphonic acid, alkali silicate, phosphate, hexafluorozirconate, chromate, borate, polyacrylamide and cellulose derivates, is advantageous.

The processing of the recording materials obtained from the mixtures is carried out in a known manner by exposure to an image and washing out the unexposed layer regions with a suitable developer.

The exposure of the recording material is carried out in a known manner under a master using copying light sources which emit as high a spectral component in the near ultraviolet region as possible. It can also be carried out by laser radiation. Suitable for the irradiation are short-wave lasers of the correct power, for example Ar lasers, krypton ion lasers, helium/cadmium lasers, which emit, for instance between 300 and 600 nm, but for some layers also $CO_2$ lasers which emit at 10.6 $\mu$m or YAG lasers which emit at 1.06 $\mu$m.

Aqueous alkaline solutions with a pH in the range from about 8 to 14, preferably about 9 to 12, which contain the buffer salts, for example, water-soluble alkali phosphates, silicates, borates, carbonates, acetates or benzoates, are used as developer solutions. Further constituents include wetting agents, preferably anionic wetting agents and, optionally, water-soluble polymers. The solutions may also contain small quantities, for example up to 5, preferably not more than 2% by weight of organic solvents miscible with water. Low-volatility solvents, for example alcohols whose vapor pressure is of no consequence in handling the developer are preferred.

The development may be carried out in a known manner by immersion, spraying, brushing or dabbing.

The developed printing plate can also be additionally post-hardened by heating to a temperature in the range from 150° to 230° C. In general, a time of 2 to 20 minutes is sufficient for the post-hardening. This can be shortened still further by adding thermally activatable initiators as described above. In this case, the thermal post-hardening can also be carried out at lower temperatures. A further advantage is the possibility of post-hardening exposing or irradiating the developed printing plate. This type of post-treatment is, in the case of a printing plate which has the two-layer system according to the invention, substantially more effective than in the case of a plate which has, for example, only a diazonium salt condensate or photopolymer monolayer.

The two-layer system according to the invention exhibits very substantial advantages compared with the known monolayers which are composed of diazonium salt polycondensation products and/or photopolymer systems. Compared with monolayers which contain only a diazonium polycondensation product and a binder, the photosensitive recording materials according to the invention exhibit a higher photosensitivity, in particular even at fairly large layer thicknesses, a more rapid development capability with aqueous alkaline developers and higher economy of use of the latter, a more favorable tonal value reproduction and a lower susceptibility to halations. Very special emphasis must, however, be placed on a markedly increased print run and also a reduced susceptibility to inks which have a higher proportion of solvents as is the case, for example, for the UV-hardenable inks. In addition, the ink receptivity of the recording materials according to the invention is improved.

Compared with monolayers which contain only a photopolymer system and a binder, the double layers according to the invention require no oxygen barrier layer. The resolution of the double layer according to the invention and also the tonal value reproduction and the reduced tendency to halations, which are not achieved by any known system, are substantially better.

Compared with monolayers which contain a combination of diazonium salt polycondensation products and photopolymers, the layers according to the invention again exhibit a markedly improved photosensitivity, better tonal value reproduction and reduced tendency to halations. A substantial advantage is, however, the markedly increased storage stability, in particular at elevated temperatures or when exposed to high atmospheric humidity.

Compared with the recording materials known hitherto, the recording materials according to the invention therefore offer advantages in many respects which allow substantial cost saving, a reduction in the time required and also substantial quality improvements.

The following illustrative examples are intended to explain the invention without limiting its scope. Parts by weight and parts by volume are in the relationship of g to cm$^3$; percentages and quantitative ratios are to be understood in units of weight unless otherwise specified.

EXAMPLE 1

An aluminum sheet electrochemically grained in nitric acid and anodized was treated with a 0.1% aqueous solution of polyvinyl phosphonic acid to improve the hydrophilic properties. The following mixture was applied to the aluminum sheet treated in this manner in a quantity such that a dry layer weight of 0.6 g/m$^2$ resulted after it had dried:

62 parts by weight of the reaction product of a polyvinyl butyral which contains 71% by weight of vinylbutyral units, 2 parts by weight of vinylacetate units and 27 parts by weight of vinyl alcohol units and has a molecular weight of 70,000 to 80,000 with maleic anhydride (acid number of the reaction product: 30), parts by weight of a diazonium salt polycondensation product prepared from 3-methoxydiphenylamine-4 diazonium sulfate and 4,4'-bismethoxymethyldiphenyl ether (molar ratio 1:1) in 85% phosphoric acid and isolated as mesitylene sulfonate, 2.5 parts by weight of 85% phosphoric acid, 3 parts by weight of Victoria Pure Blue FGA (C.I. Basic Blue 81) and 0.7 part by weight of phenylazodiphenylamine in a mixture of 2,570 parts by weight of ethylene glycol monomethyl either and 780 parts by weight of tetrahydrofuran.

After this mixture had been dried, a mixture of the following composition was applied to the aluminum sheet precoated in this manner in a manner such that after it had dried a total dry layer weight of 1.9 g/m$^2$ resulted:

60 parts by weight of the reaction product of a polyvinyl butyral with maleic anhydride described above, 18 parts by weight of the diazonium salt polycondensation product described, 3.6 parts by weight of Victoria Pure Blue FGA(C.I. Basic Blue 81), 60 parts by weight of a technical mixture of penta-erythritol tri- and tetraacrylate, 4.8 parts by weight of 2-(4-styrylphenyl)-4,6-bis-trichloromethyl-s-triazine and 1.6 parts by weight of 85% phosphoric acid in a mixture of 2,900 parts by weight of ethylene glycol monomethyl ether and 3,050 parts by weight of ethyl methyl ketone.

The two-layer copying layer was exposed under a negative master and developed with the developer solution described below:

0.2 part by weight of sodium metasilicate nonahydrate 3.9 parts by weight of disodium hydrogenphosphate dodecahydrate, 3.5 parts by weight of trisodium phosphate dodecahydrate, 1.5 parts by weight of potassium tetraborate tetrahydrate and 2.9 parts by weight of sodium octyl sulfate in parts by weight of demineralized water.

The printing plate which developed within a short time was clamped in an offset printing machine and achieved 420,000 satisfactory impressions. The plate exhibited no detectable damage.

EXAMPLE 2

A photosensitive layer of the following composition was applied to the base material described in example 1:

15.7 parts by weight of the reaction product of the polyvinylbutyral described in Example 1 with 3-oxaglutaric-anhydride (acid number of the reaction product: 50), 15.7 parts by weight of the diazonium salt polycondensation product described in Example 1, 1.0 parts by weight of 85% phosphoric acid, 1.2 parts by weight of Renol Blue B2G-HW (C.I. 74 160) and 0.2 part by weight of phenylazodiphenylamine in 1,200 parts by weight of ethylene glycol monomethyl ether.

The layer weight of the photosensitive precoating was 1.0 g/m$^2$ after drying. A second photosensitive layer with the following composition was applied to this precoating:

15.0 parts by weight of the reaction product described in Example 1 of a polyvinylbutyral with maleic anhydride, 8.8 parts by weight of the diazonium salt polycondensation product described in Example 1, 0.9 part by weight of Victoria Pure Blue FGA (C.I. Basic Blue 81), 16.8 parts by weight of the technical mixture of pentaerythritol esters described in Example 1, 1.6 parts by weight of the triazine described in Example 1 and 0.4 part by weight of 85% phosphoric acid in a mixture of
740 parts by weight of ethylene glycol monomethyl ether and
216 parts by weight of ethyl methyl ketone.

The dry layer weight of the above layer was 0.7 g/m$^2$ so that a total dry layer weight of 1.7 g/m$^2$ resulted.

The two-layer recording layer was exposed under a negative master using a metal halide lamp with a power of 5 kW for 28 seconds.

The exposed layer was developed with the developer from Example 1. For this purpose, the aluminum sheet was immersed in a trough containing the developer for 30 seconds, rinsed off with a water spray and ten rubbed with a soft pad. It was possible to remove the unexposed layer regions completely; even the finest structural elements of the master were reproduced satisfactorily.

In the copy the step 5 of a silverfilm continuous-tone stepwedge with a density range from 0.15 to 1.5 and density increments of 0.15 was still completely opaque.

250,000 impressions were manufactured with the printing plate in a sheet-fed offset machine. The examination of the plate after removal revealed that it exhibited no damage of any kind in the finest structural elements and screen parts.

EXAMPLE 3

An aluminum sheet which had been electrochemically grained with hydrochloric acid, anodized and post-treated with a 0.1% aqueous solution of polyvinyl phosphonic acid and which had an oxide weight of 4 g/m$^2$ was coated consecutively with the following photosensitive mixtures as described in the preceding Examples.

First:
35.1 parts by weight of the reaction product of the polyvinylbutyral described in Example 1 with phthalic-anhydride (acid number of the reaction product 45),
23.4 parts by weight of a diazonium salt condensation product prepared by condensing 3-methoxydiphenylamine 4-diazonium sulfate with 4-methyl-4'-methoxymethyldiphenyl ether and then with 4,4'-bis-methoxymethyldiphenyl ether (molar ratio 1:1:1) in 85% phosphoric acid and isolated as mesitylene sulfonate,
2.1 parts by weight of 85% phosphoric acid,
1.5 parts by weight of Victoria Pure Blue FGA (C.I. Basic Blue 81) and
1.1 parts by weight of phenylazodiphenylamine in
1,900 parts by weight of ethylene glycol monomethyl ether
and finally:
parts by weight of the reaction product described above of polyvinylbutyral with phthalic anhydride from Example 1 (acid number: 45),
8.8 parts by weight of the diazonium salt polycondensation product described in Example 1,
1.8 parts by weight of Victoria Pure Blue FGA (C.I. Basic Blue 81).
30 parts by weight of dipentaerythritol hexaacrylate,
2.4 parts by weight of 2-(4-methoxynaphthyl)-4,6-bistrichloromethyltriazine and
0.8 part by weight of 85% phosphoric acid in a mixture of
954 parts by weight of ethylene glycol monomethyl ether and
862 parts by weight of tetrahydrofuran.

The total dry layer weight of these two photosensitive layers was 2.2 g/m$^2$, 1.0 g/m$^2$ being due to the lower layer.

The mixture was exposed as described in the preceding Examples and developed with a developer solution of the following composition:
0.1 parts by weight of sodium metasilicate nonahydrate,
3.9 parts by weight of disodium hydrogen phosphate dodecahydrate,
3.4 parts by weight of trisodium phosphate dodecahydrate,
1.5 parts by weight of potassium tetraborate tetrahydrate,
2.0 parts by weight of potassium oxalate monohydrate,
2.5 parts by weight of sodium benzoate and
2.0 parts by weight of phenoxyethanol in
84.6 parts by weight of demineralized water.

The unexposed layer areas were already completely removed within a few seconds by wiping with a plush pad soaked in this solution.

When clamped in a sheet-fed offset machine, the image areas took the oily ink unusually rapidly. The run achieved was markedly above 400,000 impressions.

EXAMPLE 4

The aluminum sheet pretreated as in Example 1 was coated consecutively with the mixtures described below.

First:
1.5 parts by weight of the reaction product specified in Example 1 of a polyvinyl butyral with maleic anhydride,
0.7 part by weight of a diazonium salt polycondensation product of 3-methoxydiphenylamine-4-diazonium sulphate with formaldehyde,
0.1 part by weight of Victoria Pure Blue FGA (C.I. Basic Blue 81),
0.1 part by weight of 85% phosphoric acid and
0.2 part by weight of phenylazodiphenylamine in
80 parts by weight of ethylene glycol monomethyl ether
and finally:
1.5 parts by weight of the reaction product specified in Example 1 of a polyvinylbutyral with maleic anhydride,
0.6 part by weight of the diazonium salt polycondensation product described above,
1.8 parts by weight of a technical mixture of pentaerythritol tri- and tetraacrylate,
0.2 part by weight of the triazine described in Example 1 and
0.03 part by weight of 85% phosphoric acid in a mixture of
72 parts by weight of ethylene glycol monomethyl ether and
20.2 parts by weight of ethyl methyl ketone.

The dry layer weight was b 1 g/m$^2$ for each sheet.

The processing was carried out as described in Example 1. The print run in a web-fed offset printing machine was 280,000.

EXAMPLE 5 AND COMPARATIVE EXAMPLE 6

An aluminum sheet electrochemically grained in nitric acid, anodized and post-treated with a 0.1% aqueous solution of polyvinyl phosphonic acid was coated with the mixtures described in Example 1. The dry layer weight of the lower layer was 1g/m$^2$ and that of the upper layer 1.2 g/m$^2$, so that a total dry layer weight of 2.2 g/m² resulted. As a comparison a layer which corresponded in its composition to the lower layer was applied to an aluminum sheet treated in the same manner only to a dry layer weight of 2.2 g/m².

Both the sheets with equally thick coatings were irradiated for 30 seconds through a commercial negative master using a metal halide lamp with a power of 5 kW.

For the development use was made of the developer mixture from Example 3, the action being improved by lightly rubbing with a plush pad.

It was possible to develop the two-layer printing plate without stain within a few seconds. The master was reproduced with differentiation even in the fine line and screen elements. In contrast, it was only possible to develop the single-layer, equally thick plate of the comparative example very slowly and not as required in practice. Even after prolonged rubbing with the plush pad, the unexposed image regions, in particular in the fine image elements, could only be removed with difficulty.

Testing the printing plate in a printing machine showed, in addition, that the comparison plate prints without differentiation, fine non-image line elements up to a thickness of about 30 μm virtually not being reproduced.

The two-layer plate did not exhibit these inadequacies. This plate was also superior to the comparative example by approx. 35% in the required performance.

EXAMPLES 7 TO 12 AND COMPARATIVE EXAMPLES 13 AND 14

The following examples are intended to show that a variation in the layer thickness ratios of the two photosensitive layers is possible within a range of 1:20 to 1.5:1 (intermediate layer:layer) while retaining the development and printing advantages described.

For this purpose two coating solutions of the following composition were prepared and applied in different quantities to an aluminum sheet grained, anodized and hydrophilized as in Example 1 so that various intermediate layer or layer thicknesses, but a uniform total dry layer thickness resulted First:
258 parts by weight of a 6.8% solution of the reaction product of a polyvinylbutyral with a molecular weight of about 30,000 and also an OH number of 220 with maleic anhydride (acid number of the reaction product: 35) in ethyl methyl ketone,
16.7 parts by weight of the diazonium salt polycondensation product described in Example 1,
1.2 parts by weight of 85% phosphoric acid,
1.4 parts by weight of Renol Blue B2G-HW (C.I. 74160) and
0.5 part by weight of phenylazodiphenylamine in
600 parts by weight of ethylene glycol monomethyl ether and finally:
220 parts by weight of the reaction product described above of a polyvinylbutyral with maleic anhydride,
4.5 parts by weight of the diazonium salt polycondensation product described in Example 1,
1.0 part by weight of Renol Blue B2G-HW (C.I. 74160),
15.0 parts by weight of the technical mixture of pentaerythritol esters described in Example 1,
1.2 parts by weight of the triazine described in Example 1 and
0.4 part by weight of 85% phosphoric acid in
680 parts by weight of ethylene glycol monomethyl ether.

After the lower coating had dried on the sheet, the solution of the second coating was applied to it. The finally coated sheets were stored for several days without exposure to light at room temperature. Then exposure was carried out for 30 seconds with the light source described in Example 1 through a commercial negative master. The exposed plates were processed with the developer mixture described in Example 3 in the manner described there.

Before the plates were clamped in a sheet-fed offset machine, they were preserved with a commerical gumming preparation. For the Comparative Example 13 (=German Offenlegungsschrift No. 3,404,366) only the composition corresponding to the intermediate layer was applied and for the Comparative Example 14 (=P 3,528,309.2) only that corresponding to the layer was applied, albeit in each case also with the dry layer thicknesses identical to the examples.

The processing of the plates of the comparative examples was also carried out as described above.

The results obtained are summarized in the following table and show that, compared with the monolayers, the two-layer system has advantages in relation to photosensitivity and development capability and also exhibits more favorable copying and printing properties.

|  | Examples/Comparative examples | | | | | | | |
|---|---|---|---|---|---|---|---|---|
|  | 7 | 8 | 9 | 10 | 11 | 12 | 13 | 14 |
| Dry layer thickness (g/m²) of the | | | | | | | | |
| intermediate layer | 0.2 | 0.4 | 0.6 | 0.8 | 1.0 | 1.2 | 1.8 | 0.0 |
| layer | 1.6 | 1.4 | 1.2 | 1.0 | 0.8 | 0.6 | 0.0 | 1.8 |
| total layer | 1.8 | 1.8 | 1.8 | 1.8 | 1.8 | 1.8 | 1.8 | 1.8 |
| Exposure time (s) | 30 | 30 | 30 | 30 | 30 | 30 | 30 | 30 |
| Development time[a] | 12 | 12 | 12 | 12 | 12 | 12 | 25 | 15 |
| Reproduction[b] (μm) | 6–8 | 6–8 | 6–8 | 6–8 | 6–8 | 6–8 | 10 | 8–10 |
| Full tone step[c] (plate) | 4–(5) | 4–(5) | 4 | 4 | 4 | 4 | 3 | 3 |
| Blank step[c] (plate) | 7 | 7 | 6 | 6 | 6 | 6 | 8 | 7 |
| Full tone[d] (print) | 4 | 4 | 4 | 4 | 4 | 4 | 4 | 4 |
| Blank step[d] (print) | 6 | 6 | 6 | (5)–6 | (5)–6 | (5)–6 | 8 | 6–(7) |
| Reproduction[b] (print) | 8–(10) | 8–(10) | 8 | 8 | 8 | 8 | 12–15 | 12 |

|  | Examples/Comparative examples | | | | | | |
|---|---|---|---|---|---|---|---|
|  | 7 | 8 | 9 | 10 | 11 | 12 | 13 | 14 |
| Run (in thousands) | 400+ | 380 | 400+ | 400+ | 400+ | 400+ | 305 | 400[e] |

Explanatory notes:
[a]Time to completely detach the layer in the nonimage regions
[b]Reproduction of the line width in the nonimage regions. The reproduction of the line width in the image regions was 4–6 μm in all cases
[c]Halftone stepwedge with a density range of 0.15–1.5 in density increments of 0.15
[d]Determination on the printed sheet after the thousandth impression
[e]After 30,000 impressions, breakout of the 4 to 6 μm wide image lines occurred
+ and over

EXAMPLE 15 AND COMPARATIVE EXAMPLES 16 AND 17

The following examples are intended to show that the two-layer system has clear advantages in relation to storage stability compared with a monolayer.

Layers of the compositions from Example 11 and from the Comparative Examples 13 and 14 were applied to a base electrochemically grained with hydrochloric acid, anodized and post-treated with a 0.1% aqueous solution of polyvinyl phosphonic acid so that in each case a dry layer weight of 1.8 g/m² was achieved.

For each example, one sheet in each case was heated at 100° C. for one, two, three and four hours in a circulating-air oven. After the time had elapsed, the sheets were removed, cooled down and exposed and developed as described in Example 1. As a comparison, an unheated sheet was exposed and developed for each example. The following results were obtained:

| Examples/Comparative examples | 15 | 16 | 17 |
|---|---|---|---|
| Dry layer thickness (g/m²) of the | | | |
| intermediate layer | 1.0 | 1.8 | 0.0 |
| layer | 0.8 | 0.0 | 1.8 |
| total layer | 1.8 | 1.8 | 1.8 |
| Exposure time (s) | 30 | 30 | 30 |
| 0 h 100° C.: full tone step/blank step | 4/6 | 3/8 | 3/7 |
| 1 h 100° C.: full tone step/blank step | 6/8 | 5/10 | 7/9 |
| 2 h 100° C.: full tone step/blank step | 6/9 | 8/12 | 7/9 |
| 3 h 100° C.: full tone step/blank step | 8/10 | not developable | patches 8/12 |
| 4 h 100° C.: full tone step/blank step | patches 9/12 | not developable | patches 8/13 |
| scum | none | strong | yes |

EXAMPLES 18 TO 20

These examples correspond to the Example 1 with the exception that other binders, i.e. other reaction products of polyvinylbutyral were used in the two photosensitive layers in each case.

EXAMPLE 18

Instead of the binder used in Example 1, a reaction product of a polyvinyl butyral with an OH number of 220 with butyl isocyanate and maleic anhydride were employed in this example. The reaction product had a nitrogen content of 1.8% and an acid number of 35. In copying work, similar results were obtained as specified in Example 1.

EXAMPLE 19

In this example, a reaction product of a polyvinyl alcohol with 5-hydroxypentanal and butanal was employed. The reaction product had an OH number of 320. In copying and printing work similar results were achieved as specified in Example 1.

EXAMPLE 20

In this example, a reaction product of the polyvinyl butyral described in Example 1 with pyridine-2,3-dicarboxylic acid anhydride was employed. The reaction product had an acid number of 38. In copying and printing work, similar results were obtained as specified in Example 1.

EXAMPLES 21 TO 23

These examples correspond to the Example 1 with the exception that, instead of a technical mixture of pentaerythritol tri- and tetraacrylate, other unsaturated monomers were used.

EXAMPLE 21

Use of glyceryl diacrylate. In copying and printing work, similar results were achieved as specified in Example 1.

EXAMPLE 22

Use of a 1 : 1 mixture of the technical mixture of pentaerythritol tri- and tetraacrylate with a monomer which was prepared from 2 moles of hydroxyethyl acrylate and 1 mol of 2,4-diisocyanatotoluene. In copying and technical work similar results were achieved as specified in Example 1.

EXAMPLE 23

Use of a 1 : 2 mixture of the technical mixture of pentaerythritol tri- and tetraacrylate with a monomer which was prepared from 2 moles of isocyanatoethyl methacrylate and 1 mol of diethylene glycol. In copying and printing work, similar results were achieved as specified in Example 1.

EXAMPLE 24

An aluminum sheet grained electrochemically in hydrochloric acid, anodized and hydrophilized was coated with a mixture of the following composition:
87.25 parts by weight of a 13.0% solution of a reaction product of the polyvinylbutyral described in Example 1 with maleic anhydride in ethyl methyl ketone (acid number of the reaction product: 37),
11.25 parts by weight of the diazonium salt polycondensation product described in Example 1, 3.02 parts by weight of Renol Blue B2G-HW (C.I. 74 160),
0.52 parts by weight of 85% phosphoric acid and
0.20 parts by weight of phenylazodiphenylamine in a mixture of
530 parts by weight of ethylene glycol monomethyl ether, 174 parts by weight of tetrahydrofuran and 70 parts by weight of butylacetate.

The dry layer weight was adjusted to 1 $g/m^2$.

A second photosensitive layer of the following composition was applied to this photosensitive layer:
95.4 parts by weight of the solution of the reaction product described above,
7.3 parts by weight of the diazonium salt polycondensation product described above,
13.92 parts by weight of the technical mixture of pentaerythritol tri- and tetraacrylate from Example 1,
4.24 parts by weight of Renol Blue B2G-HW (C.I. 74 160),
1.29 parts by weight of the triazine described in Example 3 and
0.39 part by weight of 85% phosphoric acid in
620 parts by weight of ethylene glycol monomethyl ether and
50 parts by weight of ethyl methyl ketone.

The dry layer weight of this layer was adjusted to 0.8 $g/m^2$.

Four sheets of this two-layer system were exposed for 30 seconds to an image through a suitable negative master and then developed with the developer of Example 3. Three of the printing plates obtained were preserved by wiping over with a 3% aqueous solution of polystyrene sulfonic acid ((R)Versa TL70 manufactured by National Starch).

One of these preserved plates was then exposed to a total post-exposure of 200 seconds. A second of these plates was heated in a circulating-air drying oven for 5 minutes at 230° C.

All of these plates were clamped next to each other in a sheet-fed offset machine. A UV hardenable ink with a high proportion of solvent was used as printing ink.

The plate which had only been developed and also the preserved plate achieved runs of over 220,000 impressions. The plate post-exposed in addition achieved a run of over 280,000 impressions. The post-heated printing plate exhibited no abrasion symptoms of any kind at this point in time.

EXAMPLE 25

Lithographic printing plates were prepared as in Example 24 in which 0.5 part by weight of 2.5-dimethylhexane-2,5-ditert-butyl peroxide were added to the photosensitive intermediate layer as a 45% granulated chalk material The mixture was filtered before being applied.

The printing stencils processed as in Example 3 were preserved with a commercial preservative and then heated for 5 minutes at 200° C.

With such a plate 400,000 impressions were achieved in a sheet-fed offset machine. The lithographic plate used still exhibited no damage of any kind after this run.

EXAMPLE 26

Lithographic printing plates were prepared as in Example 24 in which 0.5 parts by weight of the peroxide described in Example 25 were added to the photosensitive layer.

If the coated sheets were developed, preserved and postheated as in Example 25, comparable results were achieved.

EXAMPLE 27

As in Example 10, coated aluminum sheets were kept unexposed in a hotbox at a temperature of 56° C. for two, six, thirteen and twenty-six weeks. After the plates had been removed in each case, they were exposed and developed as described in Example 3.

Even the plate stored for twenty-six weeks exhibited no significant difference from the original plate of Example 10 either in copying or in printing. The storage stability of the mixture is consequently excellent even at elevated temperature

EXAMPLE 28

As in Example 10, coated aluminum sheets were kept unexposed in a tropical chamber at a relative humidity of 60% and a temperature of 42° C. for one, two, five, ten and twenty weeks After they had been removed in each case, they were exposed and developed as described in Example 3.

Even the plate stored for twenty weeks exhibited no significant differences from the original plate of Example 10 either in copying or in printing. The storage stability of the mixture is consequently excellent under tropical conditions.

EXAMPLE 29

An aluminum sheet grained electrochemically in nitric acid, then anodized and post-treated with 0.1% aqueous solution of polyvinyl phosphonic acid was coated with a mixture of the following composition in a quantity such that, after it had dried, a dry layer weight of 1.2 $g/m^2$ resulted:
65 parts by weight of the reaction product of a polyvinyl alcohol whose 4% aqueous solution had a viscosity of 8 mPa.s ((R)Mowiol 8-88 manufactured by Hoechst AG) with butyral and 3-hydroxybutyral (molar ratio 1 : 1) (hydroxyl number of the reaction product: 365),
20 parts by weight of the diazonium salt polycondensation product described in Example 1,
2.5 parts by weight of 85% phosphoric acid,
3.3 parts by weight of Renol Blue B2G-HW (C.I. 74 160) and
0.6 part by weight of phenylazodiphenylamine in a mixture of
2,400 parts by weight of ethylene glycol monomethyl ether and
800 parts by weight of tetrahydrofuran.

After drying, a further photosensitive layer of the following composition was applied:
parts by weight of the reaction product specified in Example 1 of a polyvinylbutyral with maleic anhydride,
parts by weight of the diazonium salt polycondensation product described in Example 1,
3.6 parts by weight of Victoria Pure Blue FGA (C.I. basic Blue 81),
60 parts by weight of a technical mixture of pentaerythritol tri- and tetraacrylate,
4.5 parts by weight of the triazine described in Example 1 and
1.4 parts by weight of 85% phosphoric acid in a mixture of 2,400 parts by weight of ethylene glycol monomethyl ether and 3,500 parts by weight of ethyl methyl ketone The mixture exhibited a total dry layer weight of 2.3 g/m$^2$. The processing was carried out as specified in Example 3.

A lithographic printing plate with steep gradation, outstanding reproduction, low tendency to halations and clearly visible contrast was obtained.

This plate achieved a run of more than 350,000 impressions without suffering damage.

EXAMPLE 30

A pretreated aluminum sheet was coated with a photosensitive solution of the following composition:
parts by weight of the reaction product of a polyvinylbutyral ((R)Mowital B60T manufactured by Hoechst AG) with methyl isocyanate and maleic anhydride having a nitrogen content of 2.1% (acid number of the reaction product: 28),
40 parts by weight of the diazonium salt polycondensation product described in Example 1,
3.2 parts by weight of 85% phosphoric acid, 4.0 parts by weight of Renol Carmine FBB-HW (C.I. Pigment Red 146) and
0.6 part by weight of phenylazodiphenylamine in
2,500 parts by weight of ethylene glycol monomethyl ether.

The dry layer weight of this mixture was 0.3 g/m$^2$. This was coated with the photosensitive layer from Example 29, a total dry layer weight of 2.0 g/m$^2$ resulting.

The lithographic printing plate with a violet appearance was processed as described in Example 3. In this process it was possible to observe that, with careful development, first the blue-colored layer and then the red-colored lower layer were removed. The possibility of any mixing of the layers with each other is therefore ruled out.

It was possible to obtain more than 450,000 qualitatively satisfactory impressions with the finished printing plate in a sheet-fed offset machine.

What is claimed is:

1. A photosensitive copying material for use in a printing plate comprising:
    a layer base;
    a photosensitive intermediate layer on the layer base consisting essentially of an admixture of a photosensitive diazonium salt polycondensation product and a polymeric binder; and
    a photosensitive layer on the intermediate layer consisting essentially of an admixture of a photosensitive diazonium salt polycondensation product, a polymeric binder, a polymerization initiator which forms radicals when exposed to actinic radiation, and a polymerizable ethylenic unsaturated compound having a boiling point at atmospheric pressure of over 100° C.,
    wherein the photosensitive diazonium salt polycondensation product in each said layer is present in said layer in an amount sufficient to substantially decrease the layer solubility on exposure to actinic radiation and comprises repeating A-N$_2$Q and B units joined by intermediate links, which are derived from carbonyl compounds which can be condensed, and A comprises the radical of an aromatic diazonium compound which can be condensed with formaldehyde, Q is the anion of said diazonium compound, and B comprises the radical of a compound which is free of diazonium groups and can be condensed with formaldehyde,
    wherein said polymeric binder is present in each said layer in an amount sufficient to improve the resistance of the exposed layers against printing wear and is insoluble in water and soluble or at least swellable in organic solvents and aqueous alkaline solvents,
    wherein said photoinitiator is present in an amount sufficient to initiate polymerization of said polymerizable compound on exposure to actinic radiation, and
    wherein said polymerizable compound is present in an amount sufficient to form a polymerized product which decreases the solubility of said layers in combination with said photosensitive diazonium salt polycondensation product on exposure to actinic radiation.

2. A photosensitive recording material as claimed in claim 1, wherein the polymeric binders comprise at least one selected from the group consisting of hydroxyl and carboxyl groups.

3. A photosensitive recording material as claimed in claim 1, wherein the polymeric binders have acid numbers from about 10 to 250.

4. A photosensitive recording material as claimed in claim 1, wherein the polymeric binders have hydroxyl numbers from about 50 to 750.

5. A photosensitive recording material as claimed in claim 1, wherein the polymeric binders comprise reaction products of intramolecular anhydrides of organic polycarboxylic acids with polymers containing hydroxyl groups.

6. A photosensitive recording material as claimed in claim 5, wherein the intramolecular anhydride is selected from the group consisting of maleic anhydride, phthalic anhydride, succinic anhydride, 3-oxaglutaric anhydride and pyridine-2,3-dicarboxylic acid anhydride and the polymer containing hydroxyl groups is selected from the group consisting of polyvinyl acetals and polyvinyl acetates containing hydroxyl groups.

7. A photosensitive recording material as claimed in claim 5, wherein the polymeric binders comprise reaction products of intramolecular anhydrides of polycarboxylic acids and aliphatic or aromatic isocyanates with polymers containing hydroxyl groups.

8. A photosensitive recording material as claimed in claim 7, wherein the polymeric binders further comprise lateral urethane groups.

9. A photosensitive recording material as claimed in claim 1, wherein B comprises the radical of a compound selected from the group consisting of an aromatic amine, of a phenol, of a phenol ether, of an aromatic thioether, of an aromatic hydrocarbon, of an aromatic heterocyclic compound and of an organic acid amide.

10. A photosensitive recording material as claimed in claim 1, wherein the intermediate links comprise methylene groups.

11. A photosensitive recording material as claimed in claim 9, wherein the A-N$_2$Q units are derived from compounds of the formula $$(R^8-R^9)_p R^{10}-N_2 Q$$

wherein
   Q denotes the anion of the diazonium compound,
   p denotes an integer from 1 to 3, R[8] denotes an aromatic radical containing at least one position capable of condensation with an active carbonyl compound, R[10] denotes a phenylene group, R[9] denotes a single bond or one of the groups:

$$-(CH_2)_q-NR^{11}-,$$

$$-O-(CH_2)_r-NR^{11}-,$$

entire $-S-(CH_2)^r\text{-}NR^{11}$ $$-O-R_{12}-O-,$$

$$-O-$$

$$-S- \text{ or}$$

$$-CO-NR^{11}-$$

wherein q is a number from 0 to 5, r is a number from 2 to 5,

R[11] is hydrogen, an alkyl group containing 1 to 5 carbon atoms, an aralkyl group containing 7 to 12 carbon atoms or an aryl group containing 6 to 12 carbon atoms, and R[12] is an arylene group containing 6 to 12 carbon atoms.

12. A photosensitive recording material as claimed in claim 1, wherein the polymerizable, ethylenically unsaturated compound is bifunctional.

13. A photosensitive recording material as claimed in claim 12, wherein the polymerizable, ethylenically unsaturated compound has a molecular weight of about 300 to 5,000.

14. A photosensitive recording material as claimed in claim 1, wherein the ratio of the layer thickness of the photosensitive layer to the photosensitive intermediate layer is in the range from about 1:50 to 5:1.

15. A photosensitive recording material as claimed in claim 1, wherein the layer base comprises aluminum.

16. A photosensitive copying material as claimed in claim 1, wherein the intermediate layer comprises about 15 to 95% of the binder and about 5 to 90% of the photosensitive diazonium salt polycondensation product in admixture and the photosensitive layer comprises about 5 to 80% of the binder about 5 to 60% of the photosensitive diazonium salt polycondensation product, about 10 to 65% of the photopolymerizable compound, and about 0.5 to 10% of the photoinitiator in admixture.

17. A photosensitive copying material for use in a printing plate comprising:

a layer base;

a photosensitive intermediate layer on the layer base consisting essentially of an admixture of a photosensitive diazonium salt polycondensation product and a polymeric binder; and a photosensitive layer on the intermediate layer consisting essentially of an admixture of a photosensitive diazonium salt polycondensation product, a polymeric binder, a polymerization initiator which forms radicals when exposed to actinic radiation, and a polymerizable ethylenic unsaturated compound having a boiling point at atmospheric pressure of over 100° C., wherein the photosensitive diazonium salt polycondensation product in each said layer is present in said layer in an amount sufficient to substantially decrease the layer solubility on exposure to actinic radiation and comprises repeating A-N$_2$Q and B units joined by intermediate links, which are derived from carbonyl compounds which can be condensed, and A comprises the radical of an aromatic diazonium compound which can be condensed with formaldehyde, Q is the anion of said diazonium compound, and B comprises the radical of a compound which is free of diazonium groups and can be condensed with formaldehyde, wherein said polymeric binders have acid numbers from about 10 to 250, comprise reaction products of intramolecular anhydrides of organic polycarboxylic acids with polymers containing hydroxyl groups, are present in each said layer in an amount sufficient to improve the resistance of the exposed layers against printing wear, and are insoluble in water and soluble or at least swellable in organic solvents and aqueous alkaline solvents, wherein said photoinitiator is present in an amount sufficient to initiate polymerization of said polymerizable compound on exposure to actinic radiation, and wherein said polymerizable compound is present in an amount sufficient to form a polymerized product which decreases the solubility of said layers in combination with said photosensitive diazonium salt polycondensation product on exposure to actinic radiation.

* * * * *

UNITED STATES PATENT AND TRADEMARK OFFICE
CERTIFICATE OF CORRECTION

PATENT NO. : 4,956,261
DATED : September 11, 1990
INVENTOR(S) : Georg PAWLOWSKI et al.

It is certified that error appears in the above-identified patent and that said Letters Patent is hereby corrected as shown below:

Column 3, line 11, change " $-(CH_2)_q-NR^{11}13$" to
-- $-(CH_2)_q-NR^{11}-$ --.

Column 23,
Claim 11, formula (3) change from "entire $-S-(CH_2)^r-NR^{11}$" to
-- $-S-CH_2CO-NR^{11}-$,--.

Claim 16, line 6, after "binder" insert --,--;
line 9, change "0.5" to --0.05--.

Signed and Sealed this

Third Day of August, 1993

Attest:

MICHAEL K. KIRK

*Attesting Officer*        *Acting Commissioner of Patents and Trademarks*